Aug. 25, 1964 P. BOBISCH ETAL 3,146,403

TRAVELING WAVE PARAMETRIC AMPLIFIER

Filed Jan. 4, 1962

ALL DIMENSIONS
IN MILLIMETERS

INVENTORS
Peter Bobisch &
Claus Sondhauss
BY George H. Spencer
ATTORNEY

United States Patent Office 3,146,403

Patented Aug. 25, 1964

3,146,403

TRAVELING WAVE PARAMETRIC AMPLIFIER

Peter Bobisch and Claus Sondhauss, Ulm (Danube), Germany, assignors to Telefunken Patentverwertungs-G.m.b.H., Ulm (Danube), Germany Filed Jan. 4, 1962, Ser. No. 164,245
Claims priority, application Germany Jan. 4, 1961
8 Claims. (Cl. 330—4.6)

The present invention relates generally to the amplifier art, and, more particularly, to a parametric amplifier device for traveling waves.

Parametric traveling wave amplifiers are already known per se. In order to obtain the negative resistance which is necessary for amplification, capacitance diodes, inductances capable of being controlled, or an electron beam may be used. If a traveling wave amplifier is provided with capacitance diodes, at least three waves will travel together along the amplifier. The capacitance diodes are controlled by the pump wave. Another wave is the signal wave which is to be amplified by the energy of the pump wave. An idle wave is the third wave which is automatically formed. This idle wave must be active at each individual diode in order for amplification to be possible. Thus, such a parametric traveling wave amplifier comprises a transmission line system which is loaded at equidistant intervals by the afore-mentioned diode capacitances.

If all three waves are permitted to travel over the same transmission line, then only weak or low amplification will be obtained. The reason for this is the line dispersion due to which the phase condition, which is necessary for the transfer of energy from the pump waves to the signal waves and idle waves, cannot be adjusted to optimum conditions.

Compared to this, the known two transmission line system is an improvement. In this system, a common line is used for the signal wave and the idle wave, while the pump wave travels along a separate line. These amplifiers are designed as shielded parallel wire systems wherein pairs of diodes are connected at equidistant intervals between the two parallel wires or the inner conductor and the shielding or the outer conductor. The signal and idle waves travel through the amplifier as coaxial waves using the parallel wires as inner conductor, while the pump wave travels along the parallel wires in a Lecher mode. However, this amplifier arrangement has the following disadvantages:

(1) Since the signal wave and the idle wave travel over the same line their frequencies must be close to each other for reasons concerning line dispersion, so that as a practical matter the idle band is so close as to directly join the signal band. Because of this, at optimum conditions only half the usable line band width is available for the signal band width.

(2) Since the idle frequency cannot be substantially higher than the signal frequency the termination of the idling wave becomes effective as noise so that even with perfect no-loss diodes, the noise level of the amplifier is not below 3 db.

(3) The signal wave and the idle wave travel along the same line and are therefore coupled with one another. These waves must be separated before and after the amplifier by expensive frequency filters.

(4) The capacitance of the diodes varies in accordance with the pump amplitude and frequency. This causes the capacitance load of the pump line as well as of the signal and idle line to vary in rhythm with the pump frequency. This is accompanied by a considerable fluctuation of the cutoff frequency and of the dispersion properties of the lines.

With these defects of the prior art in mind, it is a main object of this invention to provide an amplifier device having three different line systems for the three types of waves which are present so as to prevent the waves from disadvantageously affecting one another.

Another object of the present invention is to provide a device of the type described wherein the capacitance variation of one diode is compensated for by corresponding variations of other diodes so that the capacitive load of the systems is kept constant by the diodes for each line at every instant.

A further object is to provide a device of the character described wherein three transmission line systems are formed by but two independent transmission lines.

These objects and others ancillary thereto are accomplished according to preferred embodiments of the invention, wherein a parametric amplifier for traveling waves is provided using capacitance diodes to obtain negative resistance which is required for the amplification. These capacitance diodes are controlled with the energy of the pump wave. Three different transmission line systems for the three waves are used, these waves being the signal wave, the idle wave, and the pump wave. An arrangement of four diodes is provided between the line systems in each of a plurality of consecutive planes which are arranged at right angles to the direction of travel of the waves. The diodes are arranged in each plane so that, with respect to their low resistance direction, they form a ring connection or ring circuit and are common to all three line systems.

Additional objects and advantages of the present invention will become apparent upon consideration of the following description when taken in conjunction with the accompanying drawings in which.

Figure 1:
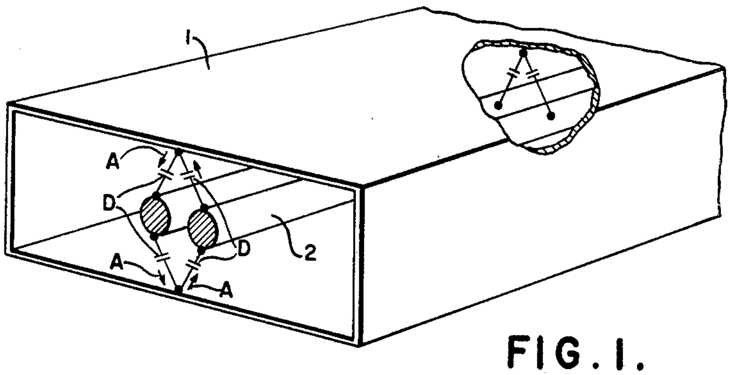
FIGURE 1 is a schematic perspective view of the present invention.

With more particular reference to the drawings, FIGURE 1 illustrates an arrangement comprising a rectangular wave guide 1 having a double conductor transmission line arranged interiorly thereof. This arrangement provides three separate transmission line systems for the three waves which are present. The first system is provided by the wave guide 1. The second system is provided by the double conductor line 2; and the third system is provided by the coaxial arrangement having the wave guide 1 as its outer conductor and the double conductor line 2 as its inner conductor.

These three line systems are connected with each other by means of capacitance diodes D in such a manner that all three lines are loaded at the same time. For this purpose, diode quartet arrangements are provided comprising four diodes disposed in a plane at right angles to the direction of travel of the waves. These diode quartets are located in consecutive planes. In each plane, the diodes are arranged so as to form a ring circuit or ring connection with respect to their low resistance direction, as indicated by the arrows A in the drawing.

When the four diodes in a quartet are equal, each system is decoupled from the other two systems. When the capacitance of the diodes of a quartet is varied by the pump waves, with the indicated polarity of these diodes, the variation of capacitance of one diode is compensated for by corresponding variations in the other three diodes. Thus, the capacitive load of the system is kept constant by the diodes for each line and at each instant, and the exchange of energy necessary for parametric amplification is still possible for each individual diode.

The selection of which line system is to be used for transmitting which of the different waves may be arranged as desired with the device of the present invention.

Figures 2, 3, 4, 5, 6:
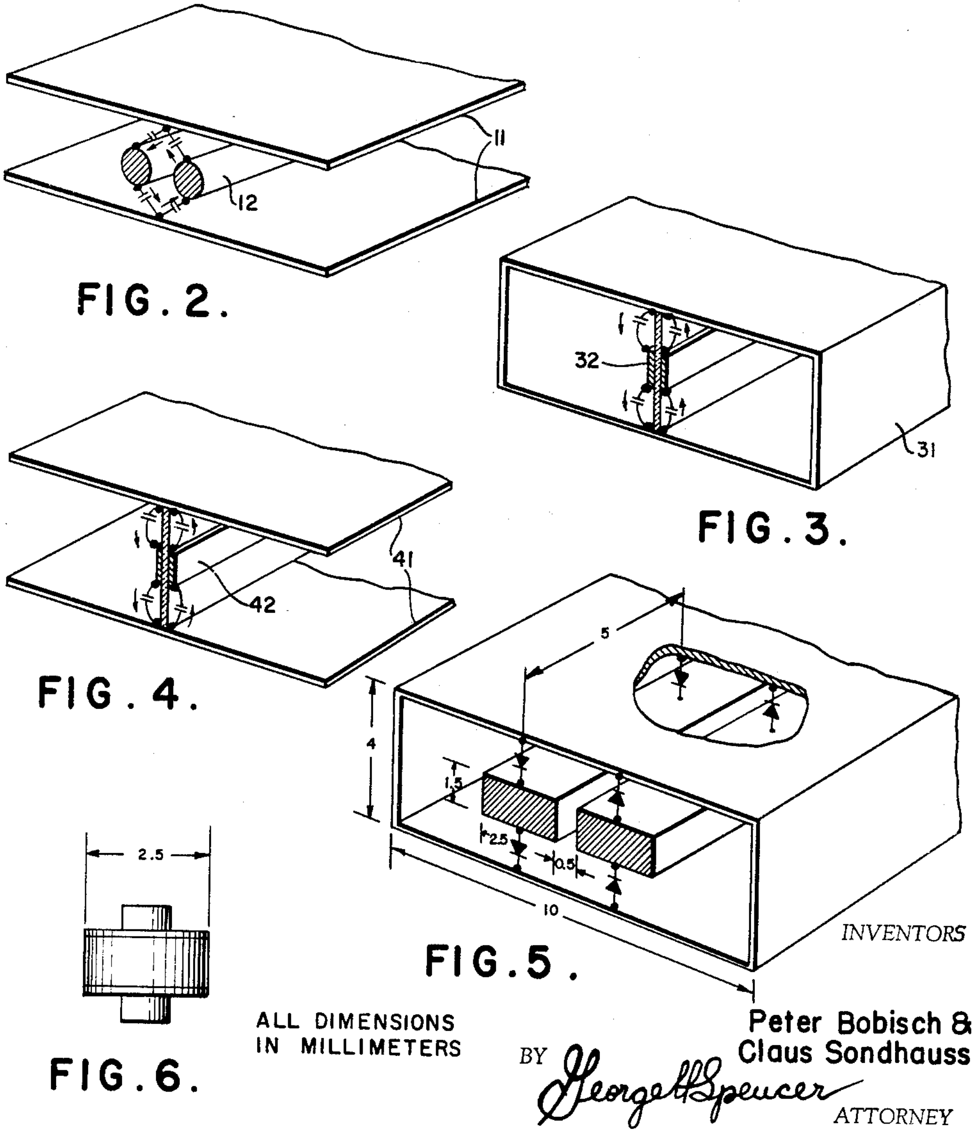
FIGURE 2 is a schematic perspective view of another embodiment having a parallel-plate-line as the outer conductor.
FIGURE 3 is a schematic perspective view of a further embodiment having a strip line as the inner conductor.
FIGURE 4 is a schematic perspective view of still another embodiment having strip lines as inner and parallel-plate-lines as outer conductors.
FIGURE 5 shows a typical construction of such a parametric amplifier.
FIGURE 6 is a schematic view of a diode used in an amplifier according to FIGURE 5.

Instead of using the rectangular wave guide shown in FIGURE 1 of the drawings, a wave guide having square or circular cross section may be used. When a rectangular wave guide is to be used, then, as shown in FIGURE 2, the two opposite walls of the wave guide may be omitted, in which case the wave guide may be considered as being replaced by a parallel-plate-line 11. This line has an inner double conductor 12.

A strip line may be provided instead of the double conductor line, as shown in FIGURE 3 where this line 32 is located within a wave guide 31.

FIGURE 4 illustrates another form wherein a parallel-plate-line 41 is the outer conductor and replaces the wave guide, and a strip line 42 is the inner conductor.

The typical construction of a part of such a parametric amplifier device is as follows according to FIGURE 5:

The coaxial wave of 2.8 km.-cycles is conducted by the coaxial system, consisting of the double conductor line as its inner conductor and the wave guide as outer conductor. The idle-wave of 5.6 kmc. runs along the double line in a Lecher-mode; the pump wave of 8.4 kmc. is guided as $TE_{10}$-mode by the rectangular wave guide.

The dimensions of such an arrangement are as follows:

A rectanguar wave guide of 4 x 10 mm.$^2$ is used. In the interior of this wave guide a double line system is located, each of these conductors being 1.5 x 2.5 mm.$^2$. The distance between these conductors is 0.5 mm. The distance between the diode quartets is in this case 5 mm. The diodes used in the arrangement according to FIGURE 5 are cylindrical with a diameter of 2.5 mm., as seen in FIGURE 6.

It will be understood that the above description of the present invention is susceptible to various modifications, changes, and adaptations, and the same are intended to be comprehended within the meaning and range of equivalents of the appended claims.

What is claimed is:

1. A parametric amplifier device for traveling waves, comprising, in combination:
   (*a*) outer transmission means and double line inner transmission means disposed within the confines of said outer transmission means for together defining three transmission line systems, one for the signal wave, one for the idle wave, and one for the pump wave; and
   (*b*) capacitance diode means for obtaining negative resistance and for maintaining the capacitance load of the device constant and including four capacitance diodes arranged for being controlled with the energy of a pump frequency and connected between said systems in each of a plurality of planes at right angles to the direction of travel of the waves and the four diodes in each plane being arranged so that they form a ring connection with respect to their low resistance direction and are common to all three systems.

2. A parametric amplifier device for travelling waves, comprising, in combination: three transmission line systems, one for the signal wave, one for the idle wave, and one for the pump wave; and capacitance diode means for obtaining negative resistance and for maintaining the capacitance load of the device constant and including four capacitance diodes arranged for being controlled with the energy of a pump frequency and connected between said systems in each of a plurality of planes at right angles to the direction of travel of the waves and the four diodes in each plane being arranged so that they form a ring connection with respect to their low-resistance direction and are common to all three systems, said systems being formed by a wave guide having a double line arranged interiorly thereof, with one of the three waves being conducted through said wave guide, another wave being conducted through the double line, and the system for the third wave being formed by the coaxial system having said wave guide as its outer conductor and said double line as its inner conductor.

3. A parametric amplifier device for travelling waves, comprising, in combination: three transmission line systems, one for the signal wave, one for the idle wave, and one for the pump wave; and capacitance diode means for obtaining negative resistance and for maintaining the capacitance load of the device constant and including four capacitance diodes arranged for being controlled with the energy of a pump frequency and connected between said systems in each of a plurality of planes at right angles to the direct of travel of the waves and the four diodes in each plane being arranged so that they form a ring connection with respect to their low-resistance direction and are common to all three systems, said systems being formed by a parallel-plate-line having a double line arranged interiorly thereof, with one of the three waves being conducted through said parallel-plate line, another wave being conducted through the double line, and the system for the third wave being formed by the coaxial system having said parallel-plate line as its outer conductor and said double line as its inner conductor.

4. A device as defined in claim 3, wherein said double line is a strip line.

5. A device as defined in claim 2, wherein said double line is a strip line.

6. A parametric amplifier device for travelling waves, comprising, in combination:
   (*a*) three transmission line systems, one for the signal wave, one for the idle wave, and one for the pump wave; and
   (*b*) four capacitance diodes arranged for being controlled with the energy of a pump frequency and connected between said systems in each of a plurality of planes at right angles to the direction of travel of the waves for obtaining negative resistance which is needed for amplification, the four diodes in each plane being arranged so that they form a ring connection with respect to their low-resistance direction and are common to all three systems, said systems being formed by a waveguide having a double line arranged interiorly thereof, with one of the three waves being conducted through said waveguide, another wave being conducted through the double line, and the system for the third wave being formed by the coaxial system having said waveguide as its outer conductor and said double line as its inner conductor, the diodes of each plane being connected to have one diode between one wall of the wave guide and one line of the double line, one diode between said one line and another wall of the wave guide opposite said one wall, one diode between said other wall and the other line of the double line, and one diode between said other line and said one wall.

7. A parametric amplifier device for travelling waves, comprising, in combination:
   (*a*) three transmission line systems, one for the signal wave, one for the idle wave, and one for the pump wave; and
   (*b*) four capacitance diodes arranged for being controlled with the energy of a pump frequency and connected between said systems in each of a plurality of planes at right angles to the direction of travel of the waves for obtaining negative resistance which is needed for amplification, the four diodes in each plane being arranged so that they form a ring connection with respect to their low-resistance direction and are common to all three systems, said systems being formed by a parallel-plate-line having a double line arranged interiorly thereof, with one of the three waves being conducted through said parallel-plate-line, another wave being conducted through the double line, and the system for the third wave being formed by the coaxial system having said parallel-plate-line as its outer conductor and said double line as its inner conductor, the diodes of each plane being connected to have one diode between one plate of the parallel-plate-line and one line of the double line, one diode between said one line and another plate of the parallel-plate-line, one diode between said other plate and the other line of the double line, and one diode between said other line and said one plate.

8. A parametric amplifier device for travelling waves, comprising, in combination:

(*a*) an outer transmission line and a double conductor inner transmission line disposed within the confines of said outer transmission line for together defining three transmission line systems; and (*b*) capacitance diode means connected between said lines for obtaining negative resistance and for maintaining the capacitive load of the device constant, said means including a plurality of sets of diodes each set arranged in a ring circuit in a different plane at right angles to the direction of travel of the waves.

References Cited in the file of this patent

UNITED STATES PATENTS

| | | |
|---|---|---|
| 3,012,203 | Tien | Dec. 5, 1961 |
| 3,045,189 | Engelbrecht | July 17, 1962 |
| 3,096,485 | Chang | July 2, 1963 |

FOREIGN PATENTS

| | | |
|---|---|---|
| 1,117,178 | Germany | Nov. 16, 1961 |

OTHER REFERENCES

Landauer: "IBM Technical Disclosure Bulletin," December 1960, page 35.